United States Patent
Vincent et al.

(10) Patent No.: US 12,243,842 B2
(45) Date of Patent: Mar. 4, 2025

(54) SEMICONDUCTOR DEVICE WITH OPEN CAVITY AND METHOD THEREFOR

(71) Applicant: NXP USA, INC., Austin, TX (US)

(72) Inventors: Michael B. Vincent, Chandler, AZ (US); Scott M. Hayes, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 186 days.

(21) Appl. No.: 17/643,198

(22) Filed: Dec. 8, 2021

(65) Prior Publication Data

US 2023/0178508 A1 Jun. 8, 2023

(51) Int. Cl.
| | |
|---|---|
| *H01L 23/31* | (2006.01) |
| *H01L 21/56* | (2006.01) |
| *H01L 23/00* | (2006.01) |
| *H01L 25/00* | (2006.01) |
| *H01L 25/065* | (2023.01) |
| *H01L 25/16* | (2023.01) |
| *H01L 23/498* | (2006.01) |
| *H01R 12/57* | (2011.01) |

(52) U.S. Cl.
CPC ............ *H01L 24/24* (2013.01); *H01L 21/565* (2013.01); *H01L 21/568* (2013.01); *H01L 23/315* (2013.01); *H01L 24/82* (2013.01); *H01L 25/0655* (2013.01); *H01L 25/16* (2013.01); *H01L 25/50* (2013.01); *H01L 23/49827* (2013.01); *H01L 24/08* (2013.01); *H01L 24/16* (2013.01); *H01L 24/32* (2013.01); *H01L 24/48* (2013.01); *H01L 2224/08225* (2013.01); *H01L 2224/16227* (2013.01); *H01L 2224/19* (2013.01); *H01L 2224/211* (2013.01); *H01L 2224/24011* (2013.01); *H01L 2224/2402* (2013.01); *H01L 2224/24155* (2013.01); *H01L 2224/32227* (2013.01); *H01L 2224/48227* (2013.01); *H01L 2224/82101* (2013.01); *H01L 2224/82105* (2013.01); *H01L 2224/82951* (2013.01); *H01R 12/57* (2013.01)

(58) Field of Classification Search
CPC .. H01L 21/568; H01L 21/565; H01L 25/0655
See application file for complete search history.

(56) References Cited

U.S. PATENT DOCUMENTS

| | | |
|---|---|---|
| 8,335,084 B2 | 12/2012 | Lee et al. |
| 8,574,967 B2 | 11/2013 | Gerber et al. |
| 8,749,002 B2 | 6/2014 | Fu et al. |

(Continued)

OTHER PUBLICATIONS

U.S. Appl. No. 17/652,188, filed Feb. 23, 2022, and entitled "Semiconductor Device With Open Cavity and Method Therefor".

(Continued)

*Primary Examiner* — Dale E Page
*Assistant Examiner* — Wilner Jean Baptiste
(74) *Attorney, Agent, or Firm* — Robert J. Amedeo

(57) ABSTRACT

A method of forming a semiconductor device is provided. The method includes placing a semiconductor die and routing structure on a carrier substrate. At least a portion of the semiconductor die and routing structure are encapsulated with an encapsulant. A cavity formed in the encapsulant. A top portion of the routing structure is exposed through the cavity. A conductive trace is formed to interconnect the semiconductor die with the routing structure.

7 Claims, 16 Drawing Sheets

(56) References Cited

U.S. PATENT DOCUMENTS

| | | | |
|---|---|---|---|
| 9,331,029 B2 | 5/2016 | Vincent et al. | |
| 9,799,636 B2 | 10/2017 | Vincent et al. | |
| 9,806,061 B2 | 10/2017 | Shen | |
| 10,103,447 B2* | 10/2018 | Tong | H01L 31/0203 |
| 10,199,302 B1* | 2/2019 | Sanchez | H01L 21/4842 |
| 11,031,681 B2* | 6/2021 | Vincent | H01P 3/121 |
| 2013/0099381 A1* | 4/2013 | Akiyama | H01L 24/05 |
| | | | 257/738 |
| 2015/0001708 A1* | 1/2015 | Lin | H01L 25/50 |
| | | | 257/737 |
| 2019/0051571 A1 | 2/2019 | Sanchez et al. | |
| 2020/0003975 A1 | 1/2020 | Yu et al. | |

OTHER PUBLICATIONS

Non-final office action dated Oct. 31, 2024 in U.S. Appl. No. 17/652,188.

* cited by examiner

SEMICONDUCTOR DEVICE WITH OPEN CAVITY AND METHOD THEREFOR

BACKGROUND

Field

This disclosure relates generally to semiconductor device packaging, and more specifically, to semiconductor devices with an open cavity and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with an open cavity. The semiconductor device includes a semiconductor die and a routing structure at least partially encapsulated with an encapsulant. The cavity is formed in the encapsulant during the encapsulation operation to expose a top surface of the routing structure including conductive feeds. The exposed feeds are configured for attachment of an external component such as a second semiconductor die, a sensor, an active element, a passive element, a connector, and the like. The semiconductor die is interconnected with one or more of the feeds by way of a package substrate. The package substrate may be formed as a build-up substrate or may be provided as a pre-formed substrate. By forming the semiconductor device with the open cavity in this manner, integration with an external component may overall have improved reliability, better performance, and lower costs.

Figure 1:
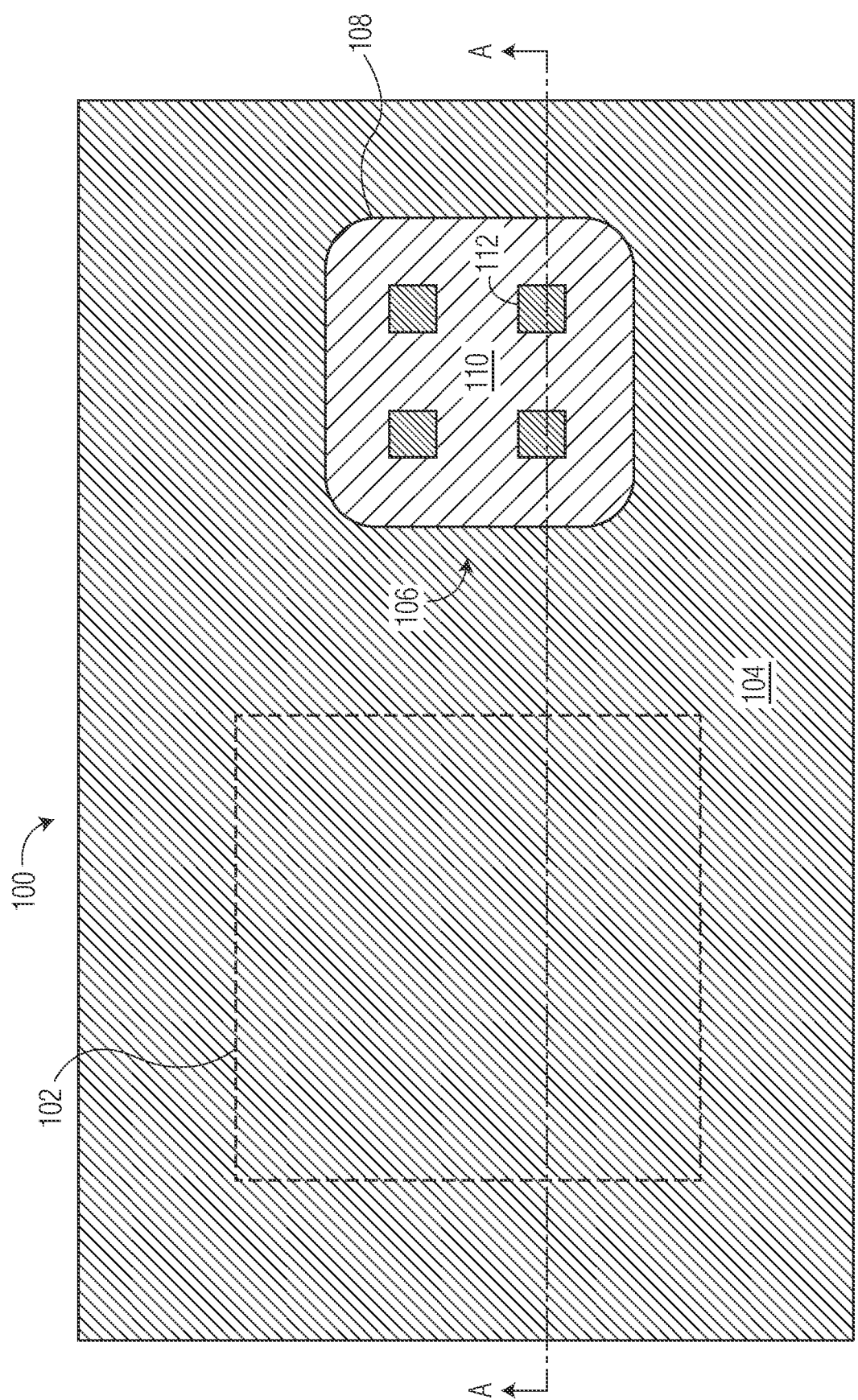
FIG. 1 illustrates, in a simplified top-side-up plan view, an example semiconductor device having an open cavity at a stage of manufacture in accordance with an embodiment.

FIG. 1 illustrates, in a simplified top-side-up plan view, an example semiconductor device 100 having an open cavity at a stage of manufacture in accordance with an embodiment. In this embodiment, the semiconductor device 100 includes a semiconductor die 102 (shown as dashed outline for reference) and a routing structure 106 encapsulated with an encapsulant 104 (e.g., epoxy molding compound). A top portion of the routing structure 106 is exposed through a cavity 108 formed in the encapsulant. The routing structure 106 includes a non-conductive substrate 110 and a plurality of conductive feeds 112. The size and shape of the cavity 108 along with the number and arrangement of the conductive feeds 112 in this embodiment are chosen for illustration purposes. In other embodiments, the cavity 108 may be formed in any suitable shape and size and the routing structure 106 may include any number of conductive feeds 112, arranged accordingly. Simplified cross-sectional views of the example semiconductor device 100 taken along line A-A at stages of manufacture are depicted in FIG. 2 through FIG. 9.

Figure 2:
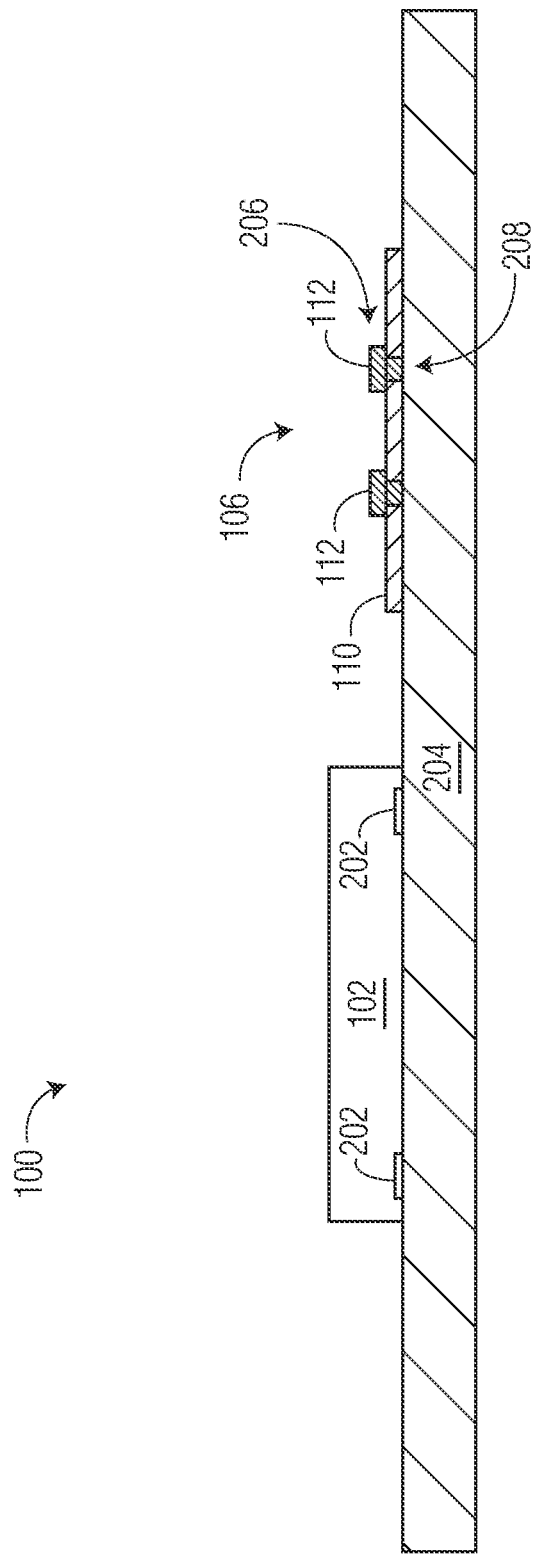
FIG. 2 through FIG. 9 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. At this stage, the semiconductor device 100 includes the semiconductor die 102 and the routing structure 106 placed on a carrier substrate 204. The carrier substrate 204 is configured and arranged to provide a temporary structure for placement of the semiconductor die 102 and the routing structure 106 during encapsulation at a subsequent stage of manufacture, for example. In this embodiment, the routing structure 106 is configured for attachment of an external component such as a second semiconductor die, an active element (e.g., transistor, diode), a passive element (e.g., resistor, capacitor, inductor), a connector, and the like.

The semiconductor die 102 has an active side (e.g., major side having circuitry) and a backside (e.g., major side opposite of the active side). The semiconductor die 102 includes bond pads 202 formed at the active side. At least one of the bond pads 202 is configured for connection to at least one of the feeds 112 of the routing structure 106 by way of a package substrate formed at a subsequent stage, for example. In this embodiment, semiconductor die 102 is configured in an active-side-down orientation with the active side placed on the carrier substrate 204. The semiconductor die 102 may be formed from any suitable semiconductor material, such as silicon, germanium, gallium arsenide, gallium nitride, and the like. The semiconductor die 102 further includes any digital circuits, analog circuits, RF circuits, memory, processor, the like, and combinations thereof at the active side.

The routing structure 106 has a top side (e.g., major side configured for attachment of an external component) and a backside (e.g., major side opposite of the top side). The routing structure 106 includes the non-conductive substrate 110 and conductive feeds 112. The substrate 110 may be formed from suitable non-conductive materials such as a laminate (e.g., Bismaleimide Triazine, FR4), ABF, ceramic, glass, and the like. The feeds 112 may be formed from one or more suitable conductive materials (e.g., metal). In this embodiment, each of feeds 112 are formed having a top side portion 206 and a feed-through portion 208. Each of the top side portions 206 are formed at the top side of the routing structure 106 having size and shapes suitable for attachment of a desired external component. Each of the feed-through portions 208 are conductively connected to respective top side portions 206 and are exposed at the backside of the routing structure 106 for connection to a package substrate at a subsequent stage of manufacture.

Figure 3:
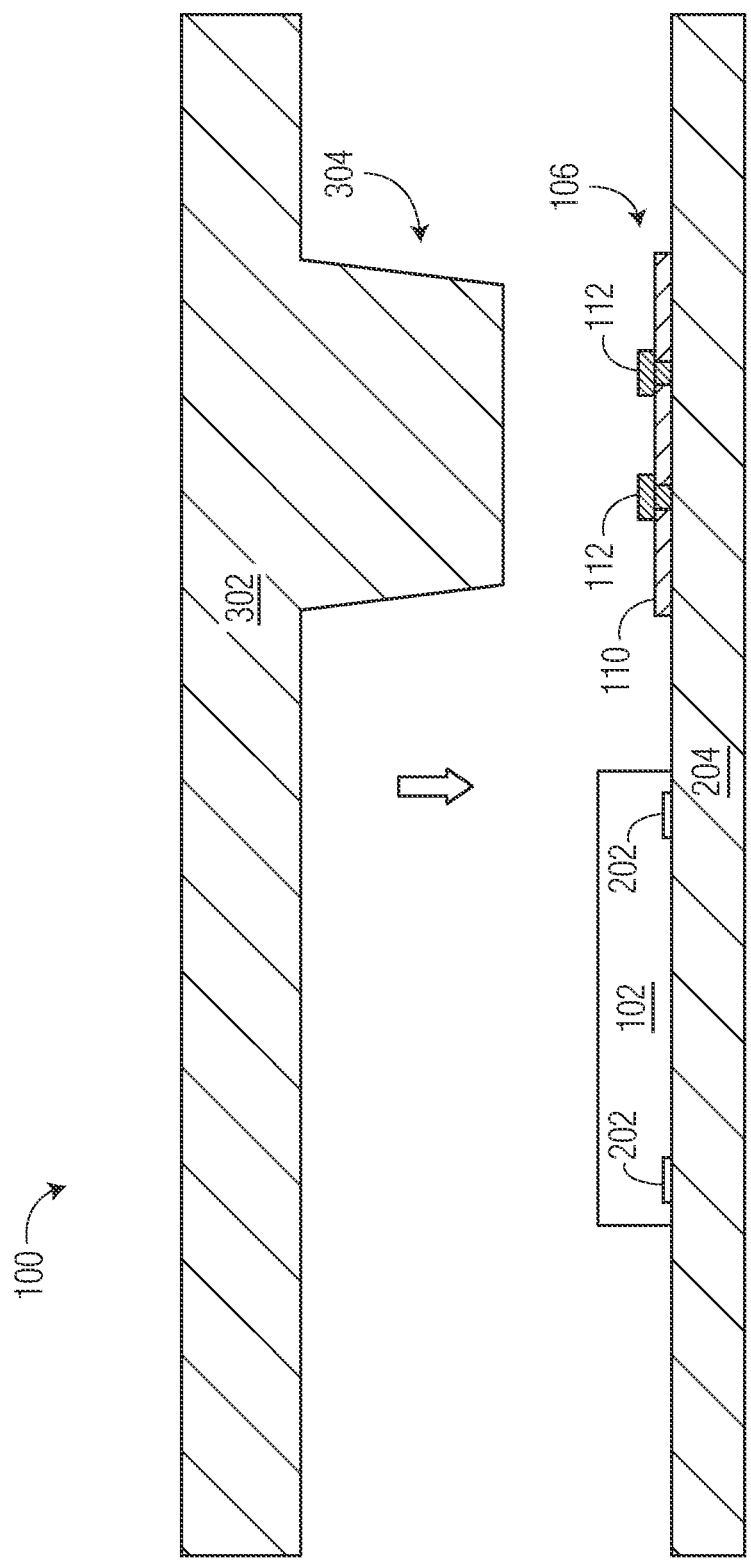

FIG. 3 illustrates, in a simplified cross-sectional view, the example semiconductor device 100 taken along line A-A at a subsequent stage of manufacture in accordance with an embodiment. At this stage, a molding tool 302 is aligned and positioned over the semiconductor die 102 and the routing structure 106 placed on the carrier substrate 204. In this embodiment, the molding tool 302 includes a protrusion portion 304. The protrusion 304 of the molding tool 302 is configured to form the cavity 108 by keeping a predetermined top side portion of the routing structure 106 free from encapsulant when engaged with the routing structure during an encapsulation operation. The molding tool 302 may be characterized as a film-assisted molding (FAM) tool using a conformal structure (e.g., film) that conforms with the shape of the molding tool during the encapsulation operation.

Figure 4:
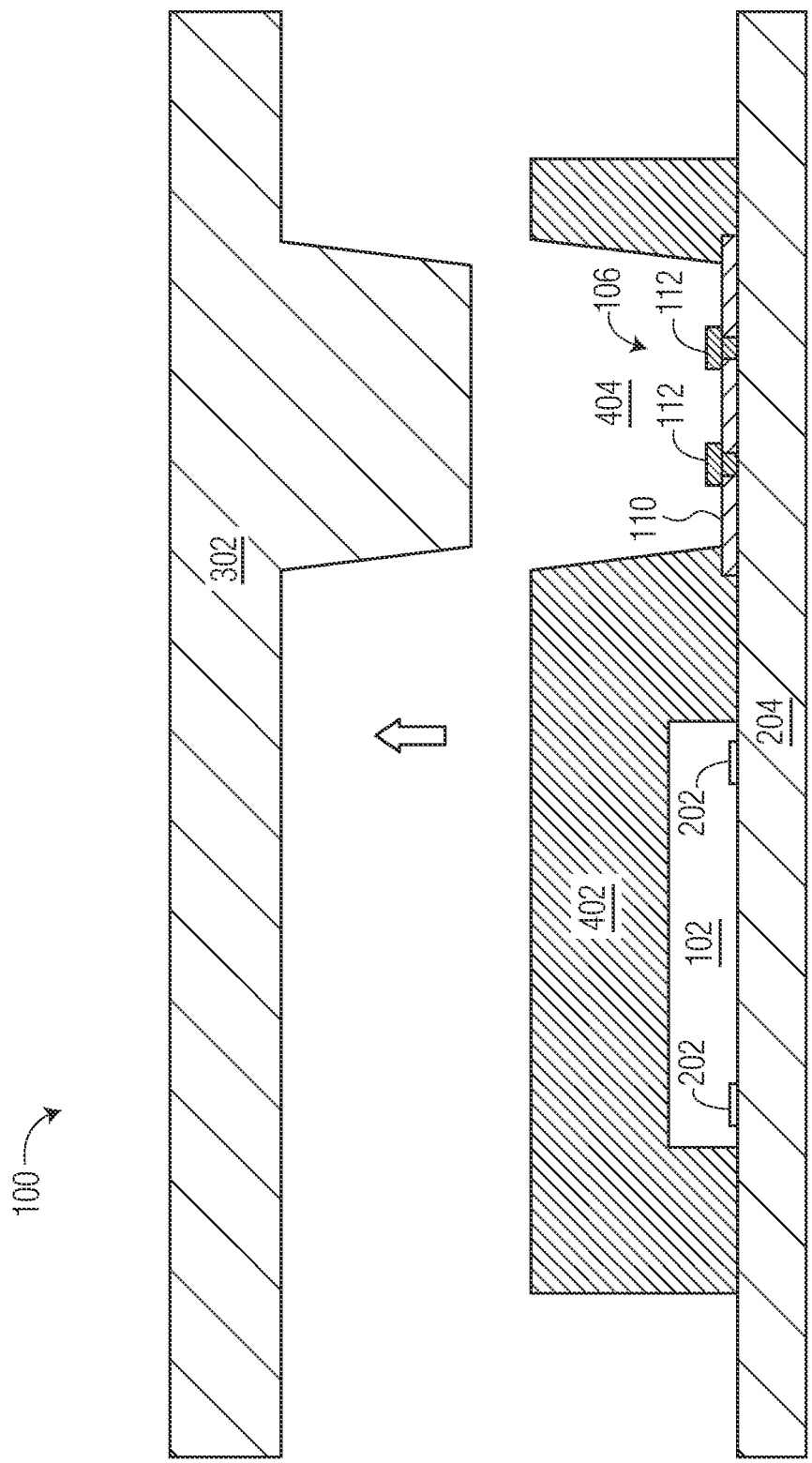

FIG. 4 illustrates, in a simplified cross-sectional view, the example semiconductor device 100 taken along line A-A at a subsequent stage of manufacture in accordance with an embodiment. At this stage, the semiconductor device 100 includes the semiconductor die 102 and portion of the routing structure 106 at least partially encapsulated with an encapsulant 402 while temporarily affixed on the carrier substrate 204. With the molding tool 302 engaged with the routing structure 106, the semiconductor die 102 and an outer portion of the routing structure are over-molded with the encapsulant 402 by way of a molding process. The encapsulated semiconductor device 100 is then separated from the molding tool 302 thereby forming an open cavity 404 as depicted in FIG. 4. The encapsulant 402, as depicted in this cross-sectional view, corresponds to the encapsulant 104 depicted in the plan view of FIG. 1.

In this embodiment, the molding tool 302 is configured to form the cavity 404 in the encapsulant 402 such that a predetermined portion of the top side of the routing structure 106 is exposed. In particular, the exposed portion of the routing structure 106 includes exposed conductive feeds 112 configured for attachment of an external component. In this embodiment, the sidewalls of the cavity 404 are formed by way of the molding tool 302 to have an angle sufficient to facilitate mold release. Because the cavity 404 is formed in this manner, the sidewall are substantially smooth.

Figure 5:
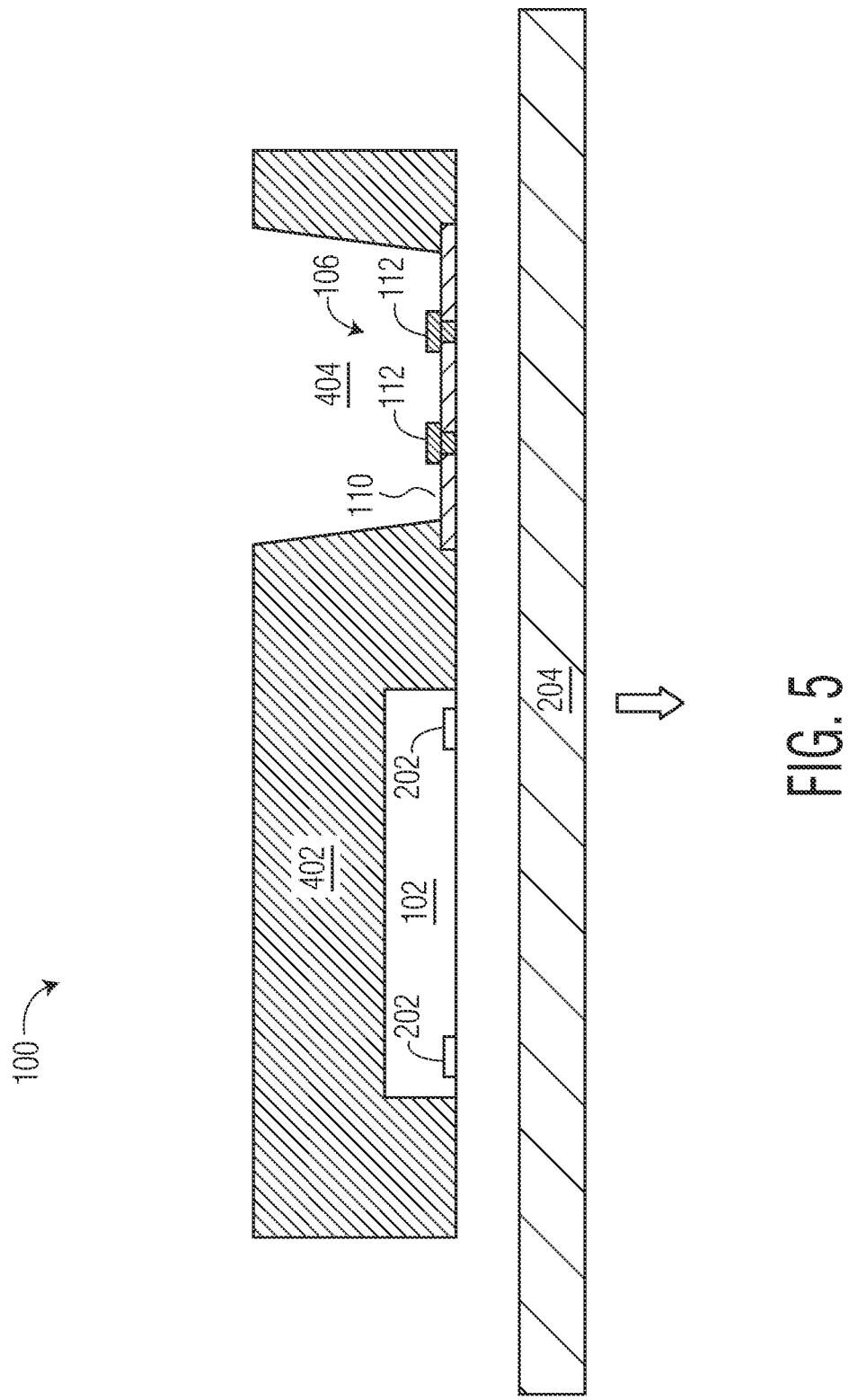

FIG. 5 illustrates, in a simplified cross-sectional view, the example semiconductor device 100 taken along line A-A at a subsequent stage of manufacture in accordance with an embodiment. At this stage, the encapsulated semiconductor device 100 is separated from the carrier substrate 204. The active side of the semiconductor die 102 and the backside of the routing structure 106 become exposed when the carrier substrate 204 is removed. In a subsequent stage of manufacture, an interconnecting package substrate may be applied, for example.

Figure 6:
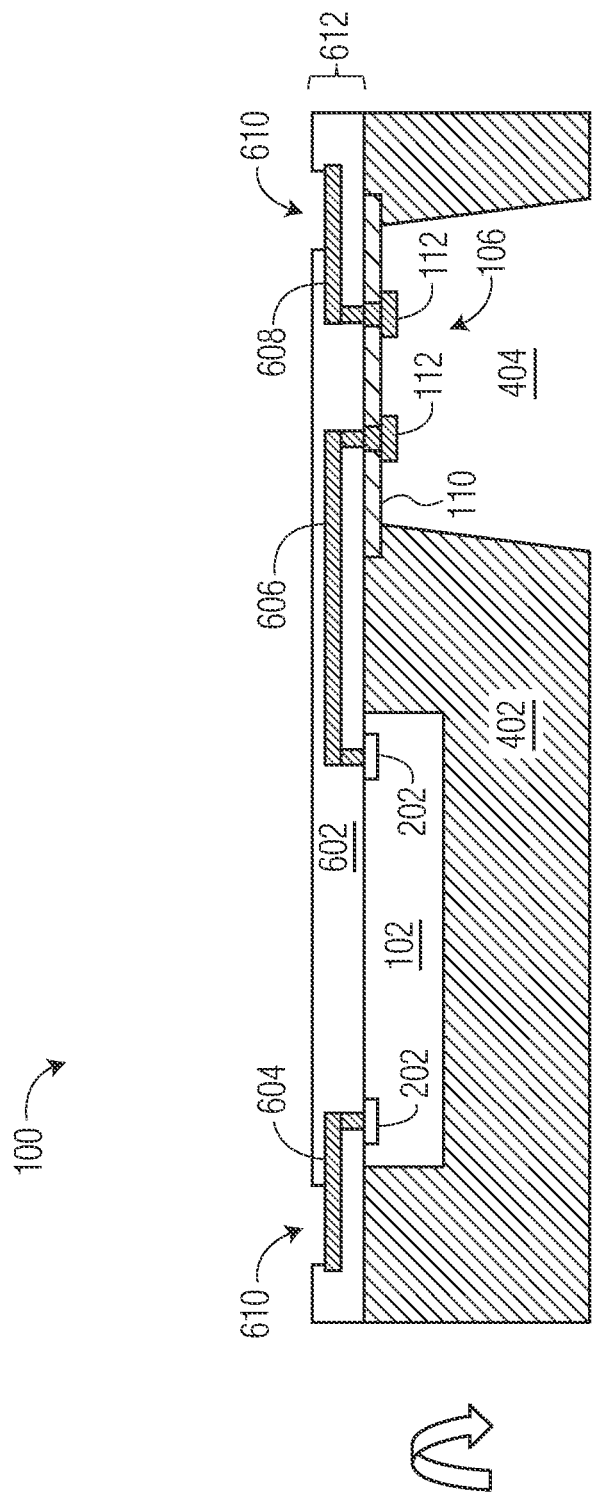

FIG. 6 illustrates, in a simplified bottom-side-up cross-sectional view, the example semiconductor device 100 taken along line A-A at a subsequent stage of manufacture in accordance with an embodiment. At this stage, an interconnecting package substrate 612 is applied to the exposed active side of the semiconductor die 102 and exposed backside of the routing structure 106. After the carrier substrate 204 is removed, the package substrate 612 is applied at the bottom side of the semiconductor device 100. The package substrate 612 includes conductive features (e.g., traces 604-608) surrounded by non-conductive material 602 (e.g., dielectric). The package substrate 612 may be formed as a build-up substrate or may be provided as a pre-formed substrate.

Conductive traces 604-608 are formed in the package substrate to interconnect the semiconductor die 102 and the routing structure 106 (e.g., trace 606) and to interconnect the semiconductor die 102 and the routing structure 106 with a printed circuit board (PCB), for example. Openings 610 in the non-conductive material 602 expose portions of traces 604 and 608 configured for attachment of conductive connectors at a subsequent stage of manufacture.

Figure 7:
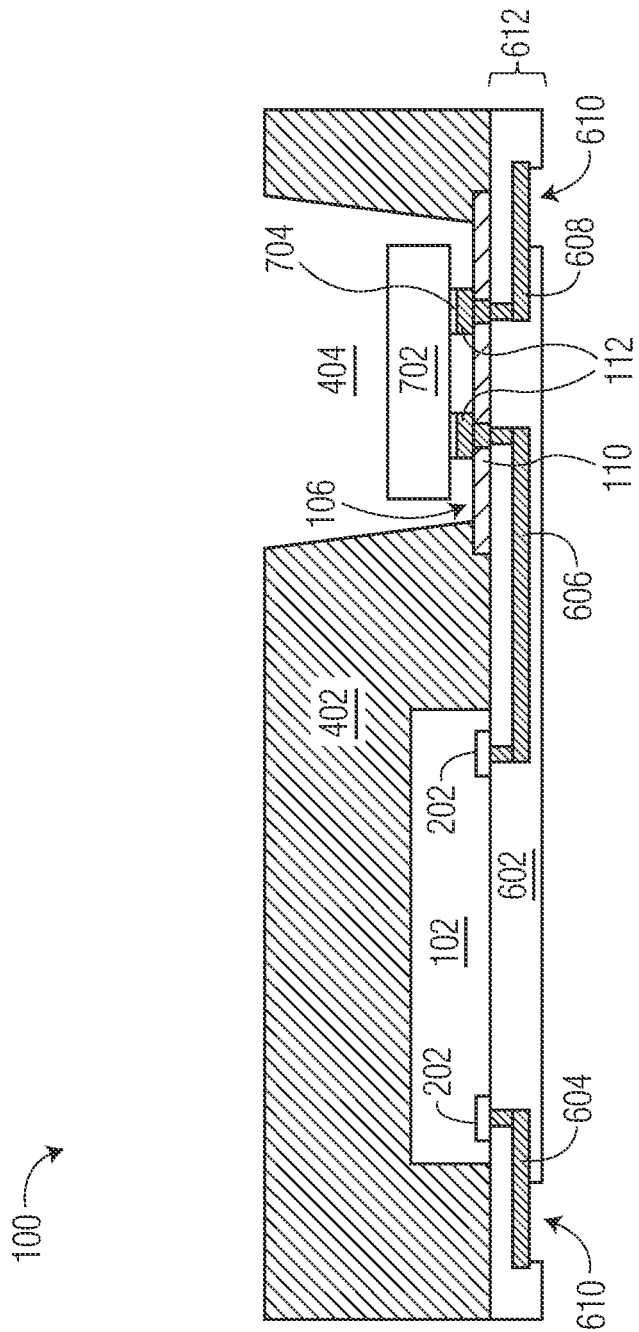

FIG. 7 illustrates, in a simplified cross-sectional view, the example semiconductor device 100 taken along line A-A at a subsequent stage of manufacture in accordance with an embodiment. At this stage, an external component 702 is attached to the routing structure 106. In this embodiment, the external component 702 includes connection pads (not shown) which are affixed to feeds 112 by way of a conductive interface material 704 (e.g., solder, solder paste, conductive adhesive). The external component 702 as depicted in FIG. 7 is chosen for illustration purposes. The external component 702 may be any of a semiconductor die, an active element (e.g., transistor, diode), a passive element (e.g., resistor, capacitor, inductor), a connector (single, multiple, coaxial) and the like. In some embodiments, an external accessory (e.g., speaker, microphone, remote device) may be connected to the semiconductor device 100 by way of the external component 702 in the form of a connector.

Figure 8:
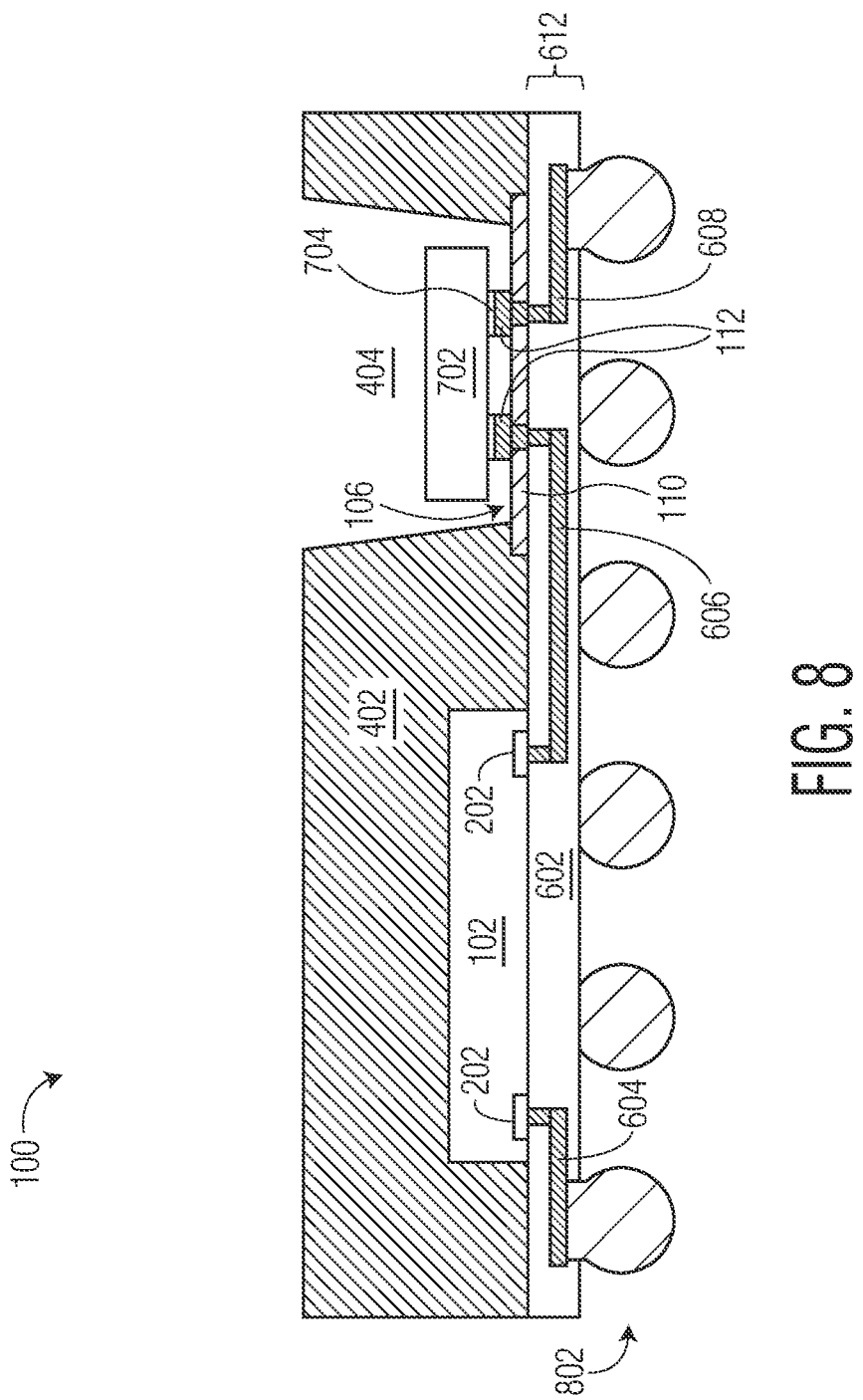

FIG. 8 illustrates, in a simplified cross-sectional view, the example semiconductor device 100 taken along line A-A at a subsequent stage of manufacture in accordance with an embodiment. At this stage, after attaching the external component 702 to the routing structure 106, conductive connectors 802 (e.g., solder balls) are affixed to a bottom surface of the package substrate 612. The conductive connectors 802 are configured and arranged to provide conductive connections between the semiconductor device 100 and a PCB, for example. The conductive connectors 802 may be in the form of any suitable conductive structures such as solder balls, gold studs, copper pillars, and the like, to connect conductive features of the semiconductor device 100 with the PCB.

Figure 9:
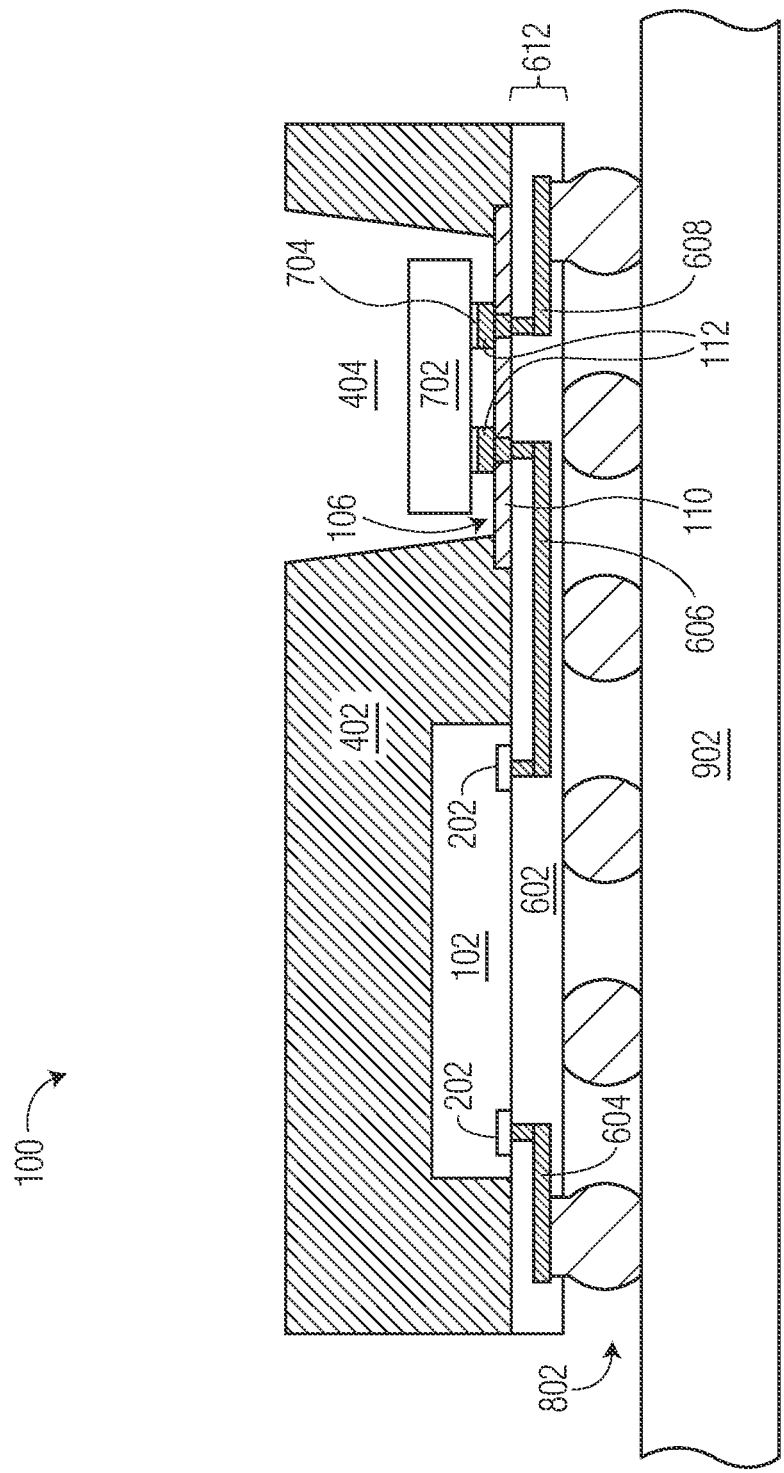

FIG. 9 illustrates, in a simplified cross-sectional view, the example semiconductor device 100 taken along line A-A at a subsequent stage of manufacture in accordance with an embodiment. At this stage, the semiconductor device 100 is attached to an example PCB 902. The conductive connectors 802 attached at the bottom of the package substrate 612 are affixed to the PCB using known techniques and materials. Conductive (e.g., metal) features of the PCB are not shown for illustrative purposes.

Figure 10:
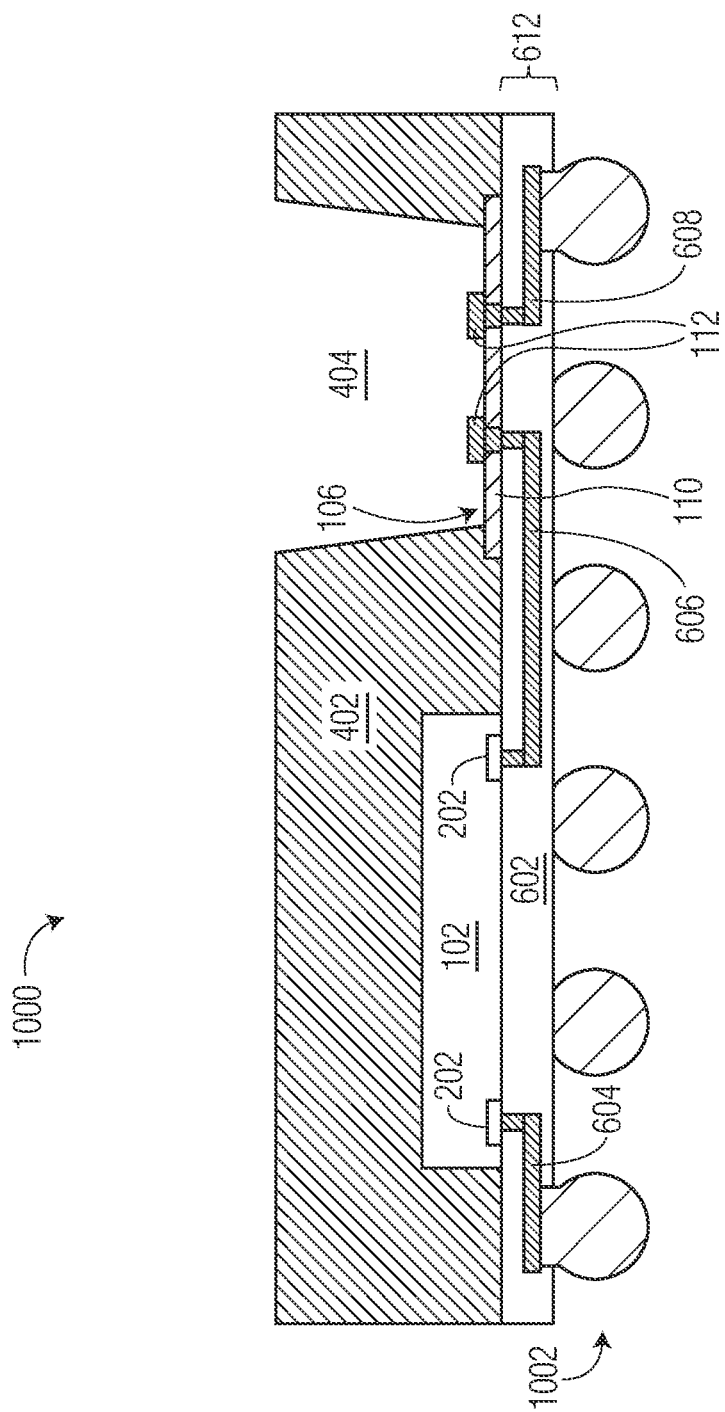
FIG. 10 through FIG. 12 illustrate, in simplified cross-sectional views, the example semiconductor device at alternative stages of manufacture in accordance with an embodiment.
Figure 11:
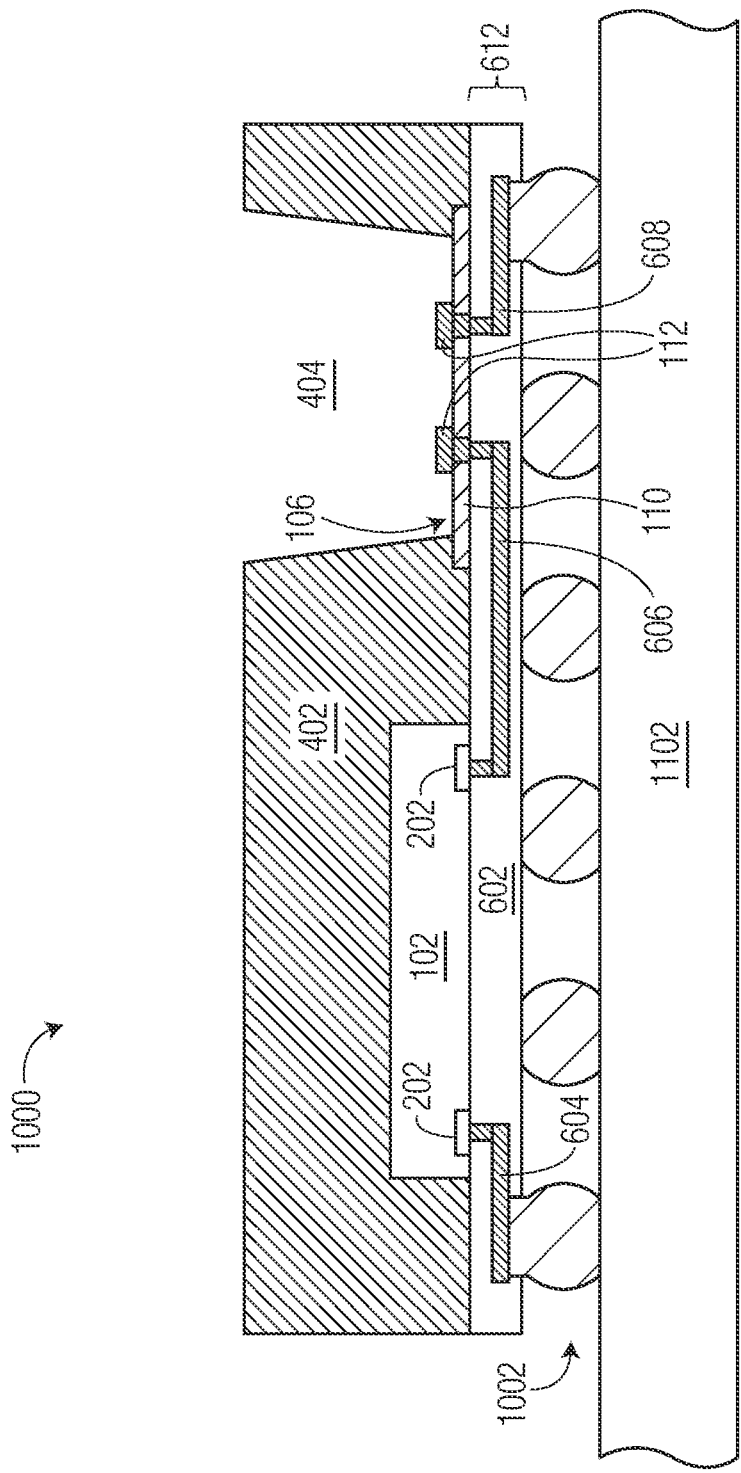
Figure 12:
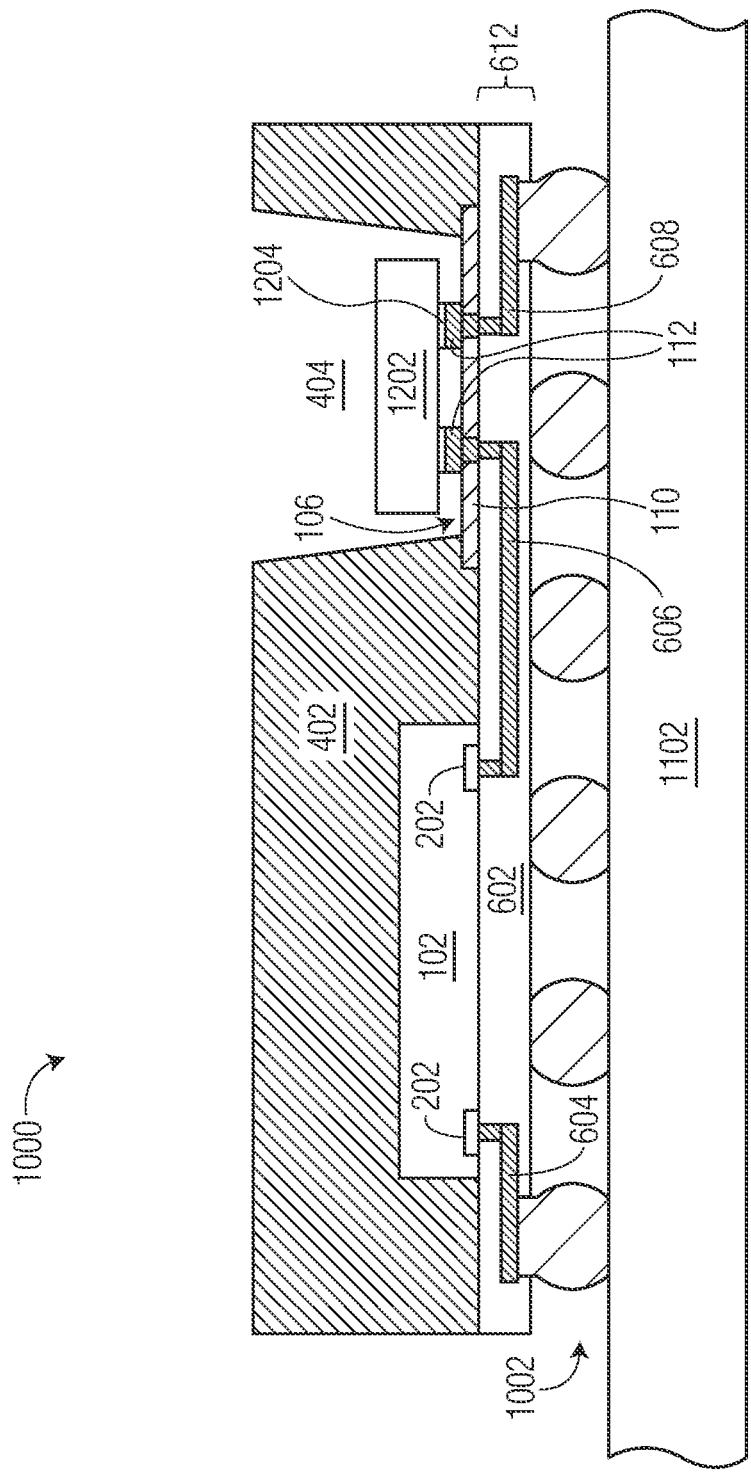

FIG. 10 through FIG. 12 illustrate, in simplified cross-sectional views, an example semiconductor device 1000 at alternative stages of manufacture in accordance with an embodiment. The stages of manufacture depicted in FIG. 10 through FIG. 12 are an alternative to the stages of manufacture depicted in FIG. 7 through FIG. 9, with stages of manufacture depicted in FIG. 2 through FIG. 6 remaining substantially the same.

FIG. 10 illustrates, in a simplified cross-sectional view, the example semiconductor device 1000 at an alternative stage of manufacture in accordance with an embodiment. The stage of manufacture depicted in FIG. 10 is an alternative stage subsequent to the stage of manufacture depicted in FIG. 6, for example. At this stage, conductive connectors 1002 (e.g., solder balls) are affixed to a bottom surface of the package substrate 612 of the semiconductor device 1000. The conductive connectors 1002 are configured and arranged to provide conductive connections between the semiconductor device 1000 and a PCB, for example. The conductive connectors 1002 may be in the form of any suitable conductive structures such as solder balls, gold studs, copper pillars, and the like, to connect conductive features of the semiconductor device 1000 with the PCB.

FIG. 11 illustrates, in a simplified cross-sectional view, the example semiconductor device 1000 at a subsequent stage of manufacture in accordance with an embodiment. At this stage, the semiconductor device 1000 is attached to an example PCB 1102. The conductive connectors 1002 attached at the bottom of the package substrate 612 are affixed to the PCB using known techniques and materials. Conductive (e.g., metal) features of the PCB are not shown for illustrative purposes.

FIG. 12 illustrates, in a simplified cross-sectional view, the example semiconductor device 1000 at a subsequent stage of manufacture in accordance with an embodiment. At this stage, an external component 1202 is attached to the routing structure 106. In this embodiment, the external component 1202 includes connection pads (not shown) which are affixed to feeds 112 by way of a conductive interface material 1204 (e.g., solder, solder paste, conductive adhesive). The external component 1202 as depicted in FIG. 12 is chosen for illustration purposes. The external component 1202 may be any of a semiconductor die, an active element (e.g., transistor, diode), a passive element (e.g., resistor, capacitor, inductor), a connector (single, multiple, coaxial) and the like. In some embodiments, an external accessory (e.g., speaker, microphone, remote device) may be connected to the semiconductor device 1000 by way of the external component 1202 in the form of a connector.

FIG. 13 through FIG. 16 illustrate, in simplified cross-sectional views, example external components affixed on the example semiconductor device 100 in accordance with embodiments. Each of the cross-sectional views depicted in FIG. 13 through FIG. 16 include a focused perspective of the cavity 404 and routing structure 106 portion of the semiconductor device 100 with an example external component attached.

Figure 13:
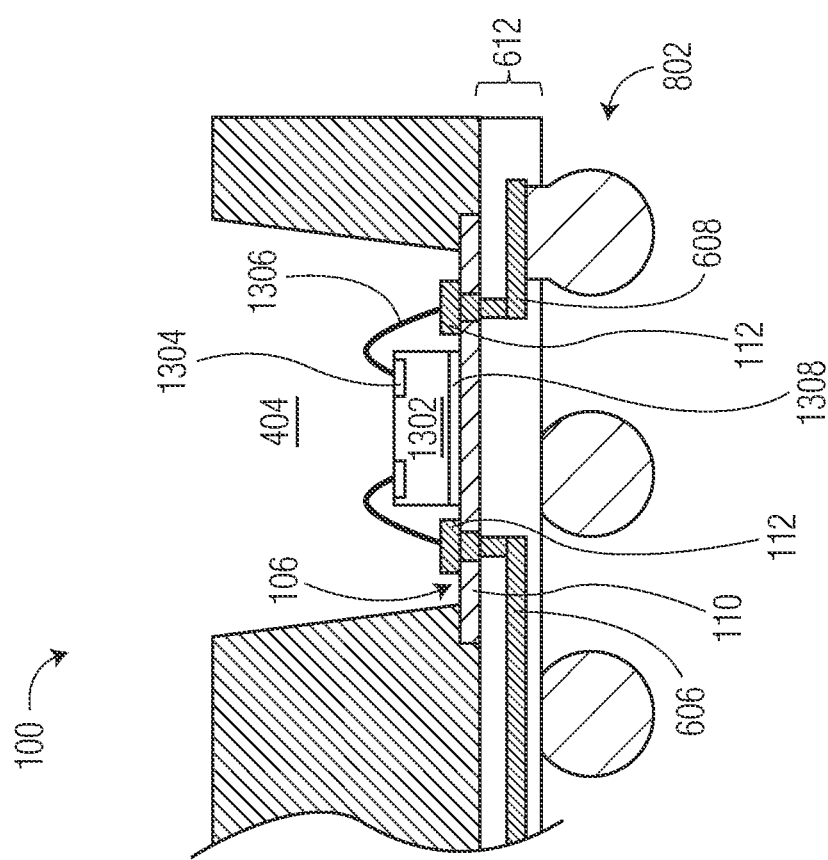
FIG. 13 through FIG. 16 illustrate, in simplified cross-sectional views, example external components affixed on the example semiconductor device in accordance with an embodiment.

FIG. 13 illustrates, in a simplified cross-sectional view, a focused portion of the example semiconductor device 100 with an example external semiconductor die 1302 attached in accordance with an embodiment. At this stage, the external semiconductor die 1302 is attached to the routing structure 106. In this embodiment, the external semiconductor die 1302 includes bond pads 1304 at an active side connected to respective feeds 112 of the routing structure 106 by way of bond wires 1306. A backside of the external semiconductor die 1302 is attached to a portion of the substrate 110 of the routing structure 106 by way of die attach adhesive material. In this embodiment, at least one of the bond pads 1304 is interconnected to the encapsulated semiconductor die 102 by way of the trace 606 of the package substrate 612. In some embodiments, a coating (e.g., gel, epoxy) may be applied over the external semiconductor die 1302 and bond wires 1306 for environmental protection. The external semiconductor die 1302 may be formed from any suitable semiconductor material, such as silicon, germanium, gallium arsenide, gallium nitride, and the like. The semiconductor die 1302 may further include any digital circuits, analog circuits, RF circuits, MEMS, sensors, memory, processor, the like, and combinations thereof.

Figure 14:
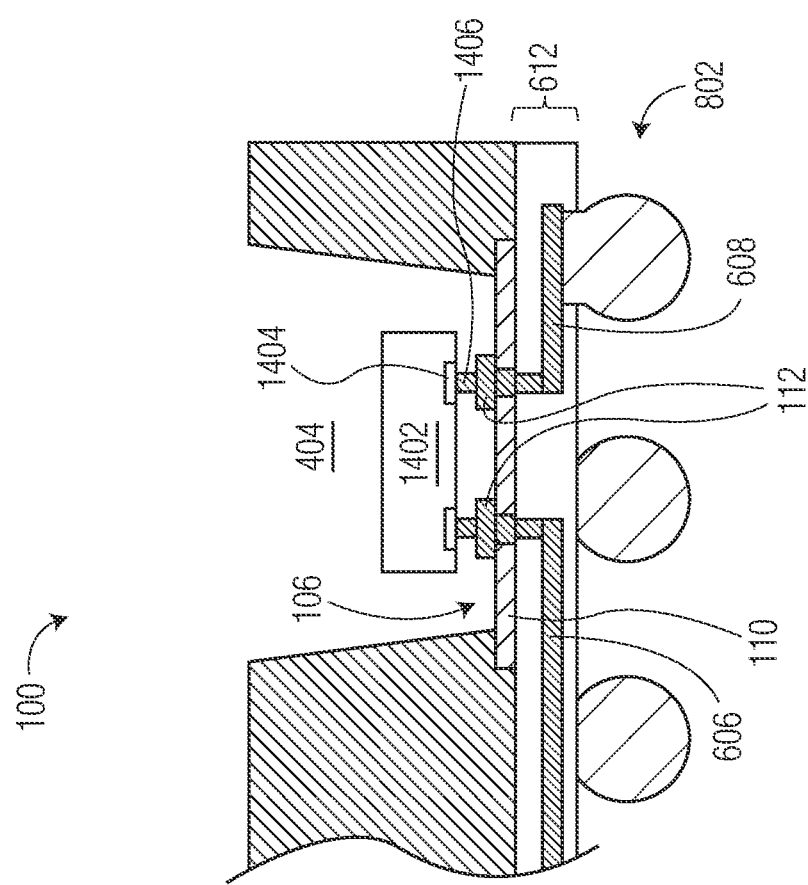

FIG. 14 illustrates, in a simplified cross-sectional view, a focused portion of the example semiconductor device 100 with another example external semiconductor die 1402 attached in accordance with an embodiment. At this stage, the external semiconductor die 1402 is attached to the routing structure 106. In this embodiment, the external semiconductor die 1402 is in an active-side-down orientation and includes bond pads 1404 at the active side connected to respective feeds 112 of the routing structure 106 by way of conductive interconnects (e.g., copper pillars, nanotubes, solder bumps) 1406. In this embodiment, at least one of the bond pads 1404 is interconnected to the encapsulated semiconductor die 102 by way of the trace 606 of the package substrate 612. In some embodiments, a coating (e.g., gel, epoxy) may be applied over the external semiconductor die 1402 for environmental protection. The external semiconductor die 1402 may be formed from any suitable semiconductor material, such as silicon, germanium, gallium arsenide, gallium nitride, and the like. The semiconductor die 1402 may further include any digital circuits, analog circuits, RF circuits, MEMS, sensors, memory, processor, the like, and combinations thereof.

Figure 15:
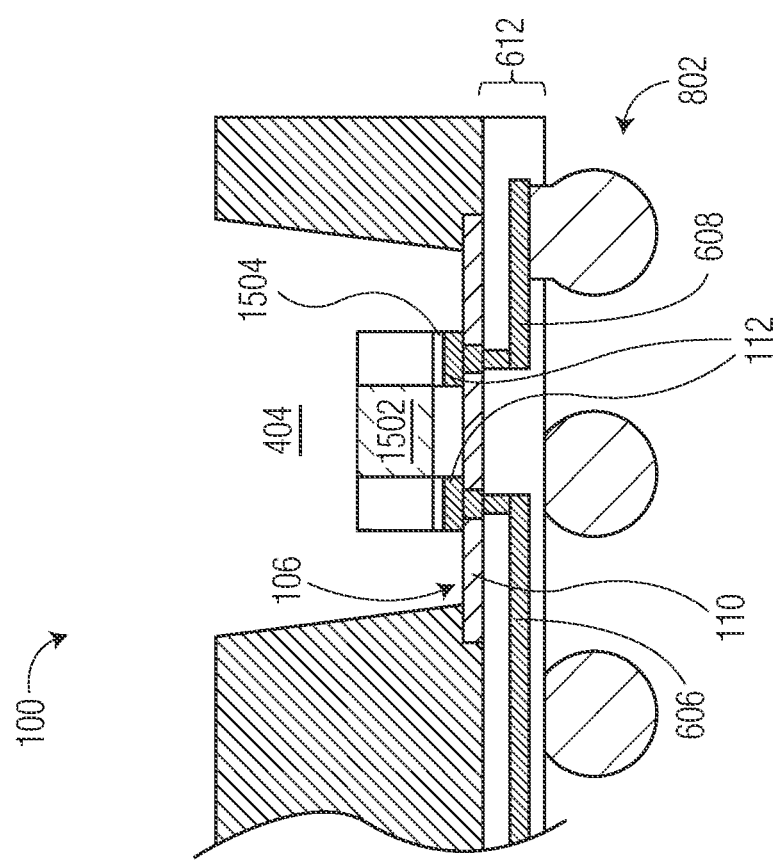

FIG. 15 illustrates, in a simplified cross-sectional view, a focused portion of the example semiconductor device 100 with an external circuit element 1502 attached in accordance with an embodiment. At this stage, the external circuit element 1502 is attached to the routing structure 106. In this embodiment, the external circuit element 1502 includes terminals connected to respective feeds 112 of the routing structure 106 by way of a conductive interface material 1504 (e.g., solder, solder paste, conductive adhesive). In this embodiment, at least one of the terminals of the external circuit element 1502 is interconnected to the encapsulated semiconductor die 102 by way of the trace 606 of the package substrate 612. In this embodiment, the external circuit element 1502 may be formed as a discrete active element (e.g., transistor, diode) or as a discrete passive element (e.g., resistor, capacitor, inductor).

Figure 16:
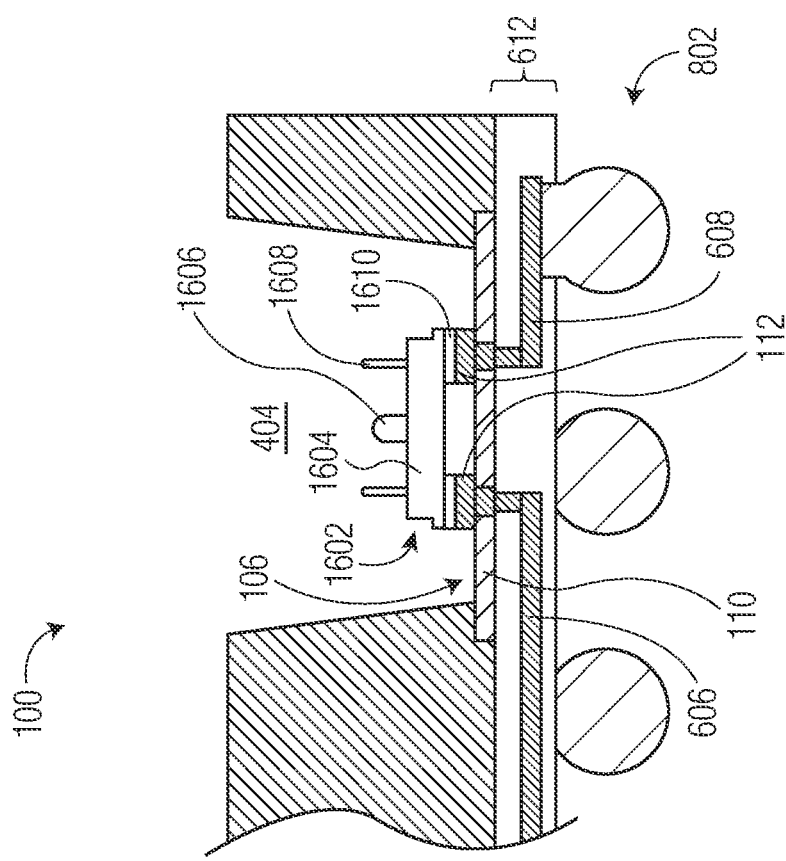

FIG. 16 illustrates, in a simplified cross-sectional view, a focused portion of the example semiconductor device 100 with an external connector 1602 attached in accordance with an embodiment. At this stage, the external connector 1602 is attached to the routing structure 106. In this embodiment, the external connector 1602 includes a base portion 1604 with signal and shield terminals connected to respective feeds 112 of the routing structure 106 by way of a conductive interface material 1610 (e.g., solder, solder paste, conductive adhesive). The external connector 1602 further includes a conductive shield member 1608 attached to the base, and the signal member 1606 electrically isolated from the shield member. In this embodiment, the signal terminal (connected to the signal member 1606) is interconnected to the encapsulated semiconductor die 102 by way of the trace 606 and the shield terminal (connected to the shield member 1608) is interconnected to a ground voltage supply terminal by way of the trace 608. In this embodiment, the external connector 1602 is configured for attachment of mating connector to connect an external accessory (e.g., speaker, microphone, antenna, remote device). In some embodiments, the external connector 1602 may be configured for providing power to an external accessory or for receiving power from an external source. For example, the external connector structure 1602 may be in the form of a plug with the mating connector in the form of a socket, or vice versa.

Generally, there is provided, a method of manufacturing a semiconductor device including placing a semiconductor die and routing structure on a carrier substrate; encapsulating with an encapsulant at least a portion of the semiconductor die and routing structure, a top portion of the routing structure exposed through a cavity formed in the encapsulant; and forming a conductive trace to interconnect the semiconductor die with the routing structure. The routing structure may include a non-conductive substrate and a plurality of conductive feeds. The encapsulating with the encapsulant may include encapsulating by way of a film-assisted molding (FAM) operation. The method may further include attaching a component to the exposed top portion of the routing structure. The component attached to the routing structure may be characterized as one of a second semiconductor die, a passive element, and a connector. The sidewalls of the cavity may be formed having an angle sufficient to facilitate mold release. The method may further include separating the carrier substrate from the encapsulated semiconductor die and routing structure to expose an active side of the semiconductor die and a backside of the routing structure. The method may further include forming a package substrate on the active side of the semiconductor die and backside of the routing structure, the conductive trace formed at least in part from a conductive layer of the package substrate. The method may further include affixing conductive connectors to a bottom side of the package substrate, the conductive connectors configured and arranged to provide conductive connections between the semiconductor device and a printed circuit board (PCB).

In another embodiment, there is provided, a semiconductor device including a routing structure comprising a non-conductive substrate; and a plurality of conductive feeds; a semiconductor die having a bond pad interconnected to a conductive feed of the plurality of conductive feeds by way of a conductive trace; an encapsulant encapsulating at least a portion of the routing structure and the semiconductor die; and a cavity formed in the encapsulant, a top portion of the routing structure exposed through the cavity. The cavity formed in the encapsulant may be formed by way of a film-assisted molding (FAM) operation. The sidewalls of the cavity may be formed having an angle sufficient to facilitate mold release. An active side of the semiconductor die and a backside of the routing structure may be coplanar. The semiconductor device may further include a package substrate formed on the active side of the semiconductor die and backside of the routing structure, the conductive trace formed at least in part from a conductive layer of the package substrate. The semiconductor device may further include a component affixed to the exposed top portion of the routing structure, the component characterized as one of a second semiconductor die, a passive element, and a connector.

In yet another embodiment, there is provided, a semiconductor device including a routing structure configured for attachment of an external component; a semiconductor die having a bond pad interconnected to the routing structure by way of a conductive trace; an encapsulant encapsulating at least a portion of the routing structure and the semiconductor die; and a cavity formed in the encapsulant, a top portion of the routing structure exposed through the cavity. The routing structure may include a non-conductive substrate and a plurality of conductive feeds, the bond pad interconnected to a conductive feed of the plurality of conductive feeds of the routing structure by way of the conductive trace. An active side of the semiconductor die and a backside of the routing structure may be coplanar. The semiconductor device may further include a build-up package substrate formed on the active side of the semiconductor die and backside of the routing structure, the conductive trace formed at least in part from a conductive layer of the package substrate. The semiconductor device may further include an external component affixed to the exposed top portion of the routing structure.

By now, it should be appreciated that there has been provided a semiconductor device with an open cavity. The semiconductor device includes a semiconductor die and a routing structure at least partially encapsulated with an encapsulant. The cavity is formed in the encapsulant during the encapsulation operation to expose a top surface of the routing structure including conductive feeds. The exposed feeds are configured for attachment of an external component such as a second semiconductor die, a sensor, an active element, a passive element, a connector, and the like. The semiconductor die is interconnected with one or more of the feeds by way of a package substrate. The package substrate may be formed as a build-up substrate or may be provided as a pre-formed substrate. By forming the semiconductor device with the open cavity in this manner, integration with an external component may overall have improved reliability, better performance, and lower costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
   placing a semiconductor die and routing structure on a carrier substrate, the routing structure including a non-conductive substrate and a plurality of conductive feeds;
   encapsulating with an encapsulant at least a portion of the semiconductor die and routing structure, a top portion of the routing structure exposed through a cavity formed in the encapsulant;
   forming a conductive trace to interconnect the semiconductor die with the routing structure; and attaching a component to the exposed top portion of the routing structure within the cavity.

2. The method of claim 1, wherein encapsulating with the encapsulant includes encapsulating by way of a film-assisted molding (FAM) operation.

3. The method of claim 1, wherein the component attached to the routing structure is characterized as one of a second semiconductor die, a passive element, and a connector.

4. The method of claim 1, wherein sidewalls of the cavity are formed having an angle sufficient to facilitate mold release.

5. The method of claim 1, further comprising separating the carrier substrate from the encapsulated semiconductor die and routing structure to expose an active side of the semiconductor die and a backside of the routing structure.

6. The method of claim 5, further comprising forming a package substrate on the active side of the semiconductor die and backside of the routing structure, the conductive trace formed at least in part from a conductive layer of the package substrate.

7. The method of claim 6, further comprising affixing conductive connectors to a bottom side of the package substrate, the conductive connectors configured and arranged to provide conductive connections between the semiconductor device and a printed circuit board (PCB).

* * * * *